(12) United States Patent
Sunkara et al.

(10) Patent No.: US 11,441,234 B2
(45) Date of Patent: Sep. 13, 2022

(54) LIQUID PHASE EPITAXY OF III-V MATERIALS AND ALLOYS

(71) Applicant: University of Louisville Research Foundation, Inc., Louisville, KY (US)

(72) Inventors: Mahendra K. Sunkara, Louisville, KY (US); Daniel F. Jaramillo-Cabanzo, Louisville, KY (US); Sonia J. Calero-Barney, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 0 days.

(21) Appl. No.: 17/068,179

(22) Filed: Oct. 12, 2020

(65) Prior Publication Data

US 2021/0108330 A1 Apr. 15, 2021

Related U.S. Application Data

(60) Provisional application No. 62/913,891, filed on Oct. 11, 2019.

(51) Int. Cl.
| | | |
|---|---|---|
| C30B 19/00 | (2006.01) | |
| C30B 19/10 | (2006.01) | |
| C30B 29/40 | (2006.01) | |
| H01L 21/02 | (2006.01) | |

(52) U.S. Cl.
CPC .......... *C30B 19/106* (2013.01); *C30B 29/406* (2013.01); *H01L 21/0254* (2013.01); *H01L 21/02625* (2013.01)

(58) Field of Classification Search
CPC ..... C30B 19/106; C30B 29/406; C30B 19/00; H01L 21/0254; H01L 21/02625
See application file for complete search history.

(56) References Cited

U.S. PATENT DOCUMENTS

| | | | | |
|---|---|---|---|---|
| 2008/0194085 A1* | 8/2008 | Sunkara | ............... | C30B 29/406 438/488 |
| 2009/0081109 A1* | 3/2009 | Einav | ..................... | C30B 23/08 423/409 |
| 2013/0333613 A1* | 12/2013 | Einav | ...................... | C30B 9/00 117/58 |

* cited by examiner

*Primary Examiner* — Robert M Kunemund
(74) *Attorney, Agent, or Firm* — WCF IP

(57) ABSTRACT

Provided herein are methods of performing liquid phase epitaxy (LPE) of III-V compounds and alloys at low pressures using pulsed nitrogen plasma to form an epitaxial layer e.g. on a substrate. The pulse sequence of plasma (with on and off time scales) enables LPE but avoids crust formation on top of molten metal. The concentration of nitrogen inside the molten metal is controlled to limit spontaneous nucleation.

14 Claims, 7 Drawing Sheets

Figure 3A    Figure 3B
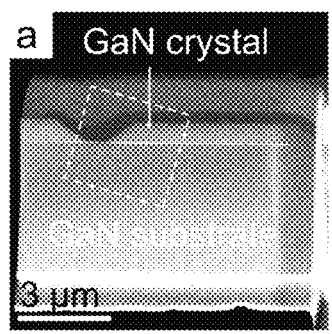 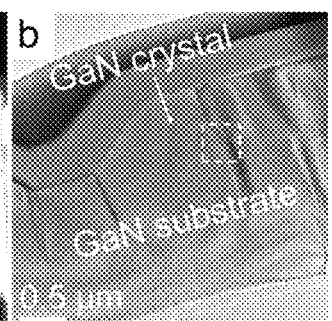
Figure 3C    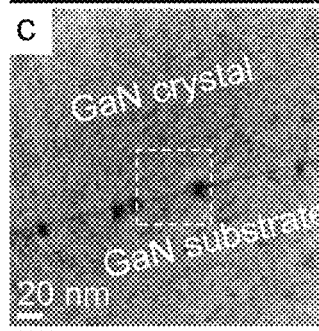 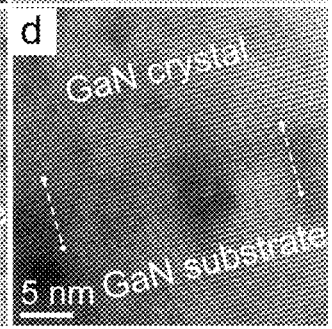    Figure 3D
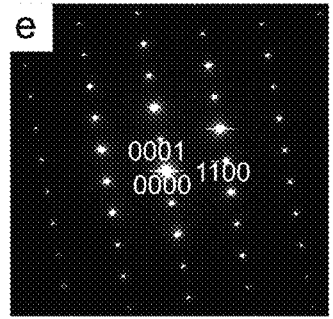 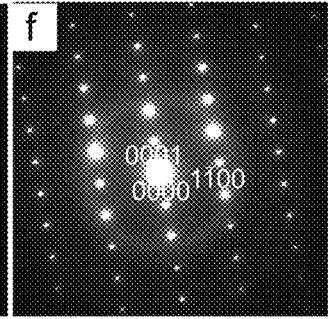
Figure 3E    Figure 3F Figure 6A
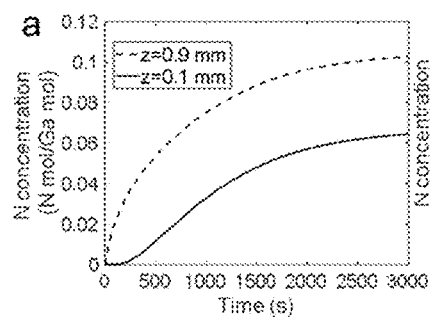
Figure 6B
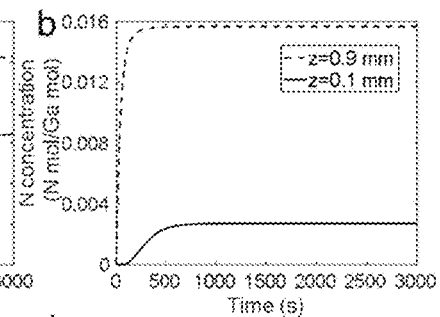
Figure 6C
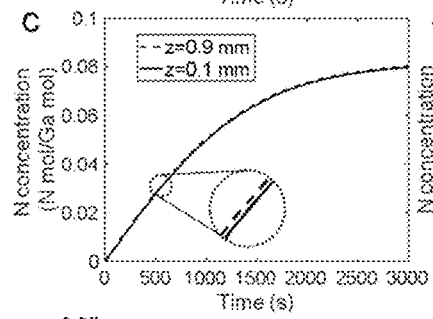
Figure 6D
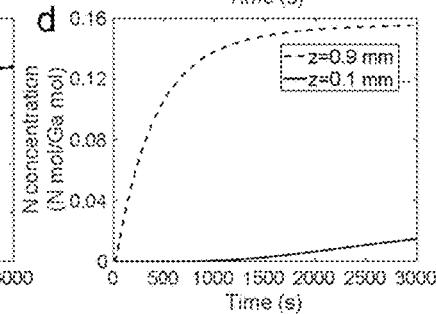
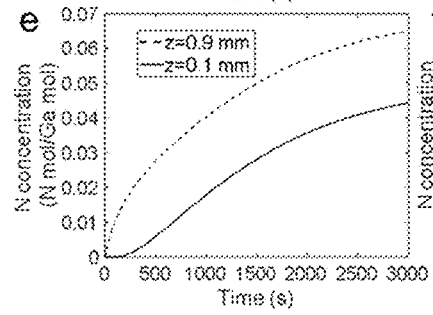
Figure 6E
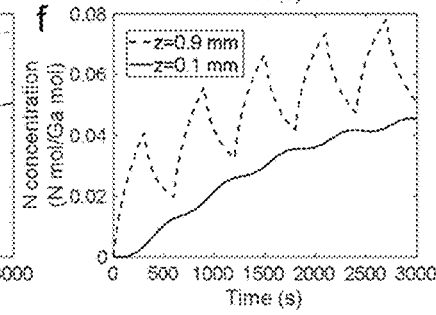
Figure 6F

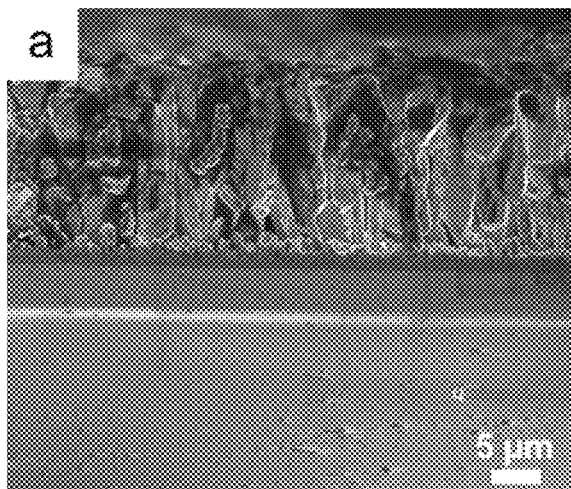 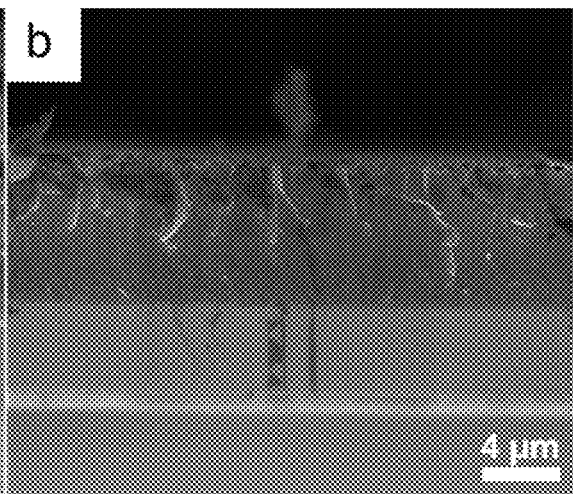
Figure 7A                    Figure 7B

Figure 8A
Figure 8B
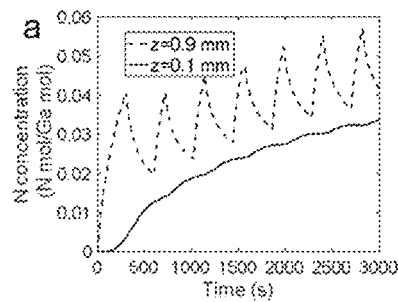
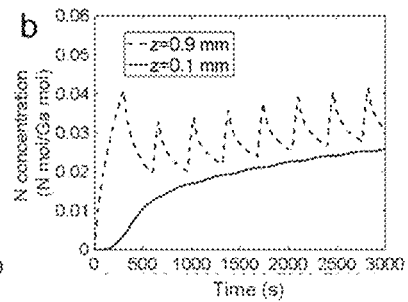
Figure 8C
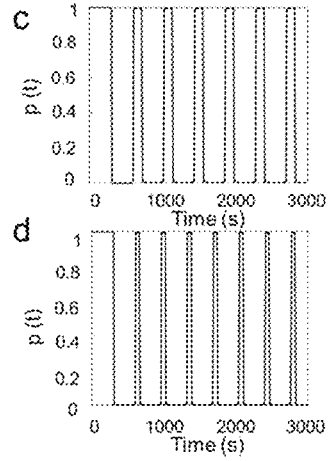
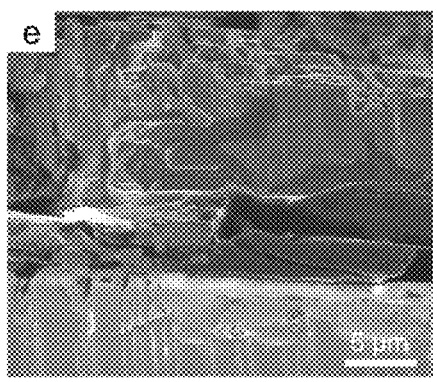
Figure 8E
Figure 8D

LIQUID PHASE EPITAXY OF III-V MATERIALS AND ALLOYS

STATEMENT OF FEDERALLY SPONSORED RESEARCH AND DEVELOPMENT

This invention was made with government support under grant number KY EPSCoR 1355438 awarded by the National Science Foundation. The United States government has certain rights in the invention.

CROSS-REFERENCE TO RELATED APPLICATIONS

This application claims benefit of United States provisional patent application filed Oct. 28, 2020.

BACKGROUND OF THE INVENTION

Field of the Invention

The invention generally relates to improved methods of liquid phase epitaxy (LPE). In particular, the invention provides methods performing LPE of III-V compounds and alloys at low pressures using pulsed nitrogen plasma to form an epitaxial layer on a substrate.

Description of Related Art

Gallium nitride (GaN), a direct bandgap semiconductor (3.4 eV), has emerged as the prime material to be utilized in the new generation of power devices. With inherent high breakdown strength, high saturation electron velocity, and good thermal conductivity,[1-2] GaN has the potential to revolutionize not only the fields of power conversion and transmission via power switches, amplifiers and transistors, but also the field of optoelectronics. In the case of power switching applications, GaN has the potential to reduce the consumption of energy in various commercial, industrial and military systems, namely smart grid, electric and hybrid vehicles and bulk energy storage, among others.[3-4] Furthermore, GaN microwave amplifiers can provide ten times more signal and power enhancement compared to Si and gallium arsenide (GaAs) devices in cell phones.[5] GaN also offers the ability to form heterojunctions, making this material suitable for fabrication of high electron mobility transistors (HEMTs).[6] Finally, the blue and UV light emission of GaN is of great interest in optoelectronics, specifically in the light, display, and storage industries as it can make light bulbs last up to ten years, brighten flat panel displays, and quadruple the storage capacity of traditional optical storage devices such as CDs and DVDs.[7-8]

Despite the huge technological interest, the progress in high power electronics and long-term applications has been slow due to the high cost of low defect density bulk GaN wafers. As a result of the strong binding energy of the Ga—N bond, GaN has a high melting point of 2500° C.[9] At that temperature, the nitrogen partial pressure in equilibrium with the solid GaN is over $5 \times 10^4$ bar.[10] When the pressure of the system is lower than the equilibrium pressure, GaN does not melt but decomposes. Because of that, bulk GaN cannot be grown using standard atmospheric melt-growth methods.

Different techniques have been proposed to produce bulk GaN, e.g. high-pressure solution (HPS), the ammonothermal, and the Na flux techniques.[10-15] These bulk synthesis methods, however, are characterized for being performed under extreme temperatures and pressures for long periods of time making them cost prohibited and therefore noncompetitive for production.[16]

Due to the lack of a commercial technique for bulk GaN, current GaN-based devices are made primarily on sapphire, silicon carbide (SiC) or silicon (Si) substrates utilizing vapor deposition techniques i.e., hydride vapor phase epitaxy (HYPE), metal organic chemical deposition (MOCVD), and molecular beam epitaxy (MBE).[2] With growth rates as high as 1000 µm/h, HYPE is sometimes consider a bulk technique.[17] Although this characteristic is desired for growing GaN substrates, the difficulty of controlling the final thickness of the grown GaN film, makes HYPE not suitable for thin film applications.[18] Additionally, HYPE uses hydrochloric acid (HCl) as precursor which requires additional safety measures.[19] MOCVD and MBE, on the other hand, are used for thin film applications. Typical growth rates of MOCVD and MBE processes are 1-3 µm/h and <1 µm/h, respectively.[20] The slower growth rate of these techniques can control the thickness of the film appropriately. MOCVD and MBE process are also used for the growth of highly-crystalline GaN nanowires (NWs).[21-22] However, the slow growth rate makes these techniques relatively expensive. Furthermore, MOCVD-grown GaN films suffer from carbon contamination due to the use of metal-organic precursors.[23]

Low-pressure liquid phase epitaxy (LP-LPE) has been identified as an alternative technique to grow GaN in a controlled fashion without utilizing precursors that are either hazardous or induce impurities to the material.[24] In LP-LPE of GaN, molecular nitrogen is replaced by other chemical species (e g ammonia ($NH_3$), and nitrogen radicals (N)), which supply atomic nitrogen to the Ga melt, to avoid the use of high pressures. The partial pressure of $NH_3$ and N in equilibrium with solid GaN is over $1 \times 10^6$ and $1 \times 10^{11}$ times smaller than that of $N_2$, respectively, which allows growth of GaN at much lower pressures when these precursor are used.[25-26] One of the main challenges in LP-LPE of GaN is to prevent spontaneous nucleation of GaN. Spontaneous nucleation has been found to be harmful to LP-LPE of GaN in three different ways. First, crystals that have been grown through homogeneous nucleation compete with the substrate used in this process as centers for epitaxial growth.[27-28] Second, crystals can precipitate and deposit onto the substrate surface inducing defects in the LPE grown layers.[29] Lastly, homogeneous nucleation near the surface of the melt promotes the formation of a polycrystalline crust on top of the molten metal. This film acts as a diffusion barrier that prevents the incorporation of any gaseous species into the melt limiting further growth.[30-31] Sun et al. and Hussy et al. determined the existence of an Ostwald-Miers region in relation to the partial pressure of ammonia and the process temperature for LP-LPE of GaN.[27-28] This region determines the conditions in which the growth of GaN occurs only on the seed. Conversely, spontaneous nucleation of GaN takes place when the partial pressure of ammonia in the system is higher than the ammonia partial pressure at the upper limit of the Ostwald-Miers region for a given process temperature.[27-28] Tanaka et al., however, argued that spontaneous nucleation of GaN is a consequence of the concentration of nitrogen inside the Ga and not the partial pressure of $NH_3$ in the chamber.[32] In an attempt to reduce the concentration of nitrogen at the surface of the Ga melt Novikov et al. proposed to apply a DC current through the growth cell in their plasma-assisted LPE set up. By doing this, the researchers were expecting to promote the transport of N from the surface of the melt to the substrate prevents the formation of a GaN crust on the surface on the melt. The researchers reported the nucleation of GaN islands on sapphire (0001) and GaN-on-sapphire substrates at ~650° C. and ~3×10$^{-5}$ torr. By increasing the growth time, those islands coalesced into a continuous layer. However, the results showed that the growth rate was very low, and the uniformity was poor. After 60 hours of growth, it was possible to observe pin holes as big as 10 μm.[33]

There is a need in the art to provide rapid, low cost methods of making GaN films, while minimizing pore formation, contamination of the films and the use of noxious chemicals in the process.

SUMMARY OF THE INVENTION

Provided herein are methods of performing liquid phase epitaxy (LPE) at low pressures using pulsed (or interrupted) Group V plasma. A pulsed sequence of Group V plasma (with on and off time scales) is used to enable LPE while avoiding crust formation on top of a molten Group III metal. The methods also involve controlling the concentration of the Group V material inside the molten Group III metal to limit any type of spontaneous nucleation. This is a first-of-its-kind demonstration for achieving liquid phase epitaxy using plasma excitation of a Group V material at low pressures. The disclosed methods are applicable to e.g. type III-V compounds and alloys, such as the exemplary GaN.

Other features and advantages of the present invention will be set forth in the description of invention that follows, and in part will be apparent from the description or may be learned by practice of the invention. The invention will be realized and attained by the compositions and methods particularly pointed out in the written description and claims hereof.

It is an object of this invention to provide a method of making an epitaxial layer of a III-V compound, comprising I) positioning a liquid phase Group III metal or alloy thereof on a substrate; and II) exposing the liquid phase Group III metal or alloy thereof to a pulsed Group V plasma to form the epitaxial layer of the III-V compound on the substrate. In some aspects, the Group III metal or alloy thereof is Ga and the Group V plasma is nitrogen plasma. In some aspects, the step of exposing is performed under low pressure. In further aspects, prior to the step of exposing, the method comprises a step of reducing the liquid phase Group III metal or alloy thereof. In additional aspects, the step of reducing is performed at a temperature in the range of from about 500° C. to about 600° C. In other aspects, the step of exposing is performed at a temperature in the range of from about 200 to about 1000° C. In additional aspects, the step of exposing is performed with a pulse sequence in which the plasma is i) on for an initial period of time, then ii) off for a first period of time and then on for a second period of time; wherein step ii) is repeated a plurality of times. In further aspects, the initial period of time and the first period of time are the same. In yet further aspects, the second period of time is shorter than the first period of time. In additional aspects, the initial period of time ranges from 0.1-10 minutes, the first period of time ranges from 0.5-10 minutes and the second period of ranges from 0.1-10 minutes. In further aspects, step ii) is performed at least twice.

BRIEF DESCRIPTION OF THE DRAWINGS

FIG. 3A-F. TEM characterization of the GaN crystals obtained in the thickest area of the Ga film. (A) SEM image of the TEM lamella used during characterization. White outlined area indicates the (B) area that was analyzed using TEM. (C) TEM image of the crystal/substrate interface region. White outlined area indicates the interface between the grown layer and the substrate. (D) [11$\bar{2}$0] high-resolution TEM image of the interface. The area between the dashed lines indicates where the interface is. (E) Electron diffraction pattern of the substrate. (f) Electron diffraction pattern of the grown crystal. Both patterns show the same [11$\bar{2}$0] zone axis and the same orientation.

FIG. 6A-F. Effect of bulk recombination, diffusion, and pulsing in the concentration of nitrogen inside a 1 mm thick Ga film. (A) Concentration profile of the base case i.e., D_NGa=5×10$^{-6}$ cm$^2$ s$^{-1}$, p(t)=1 and k_BR=1×10$^{-1}$ cm$^3$ mol$^{-1}$ s$^{-1}$. (B) Effect of bulk recombination was evaluated by modifying the value of k_BR in the base case to k_BR=10 cm$^3$ mol$^{-1}$ s$^{-1}$. Effect of diffusion was evaluated by modifying the value of D_NGa in the base case to D_NGa=(C) 5×10$^{-4}$ and (D) 5×10$^{-7}$ cm$^2$ s$^{-1}$. Effect of pulsing was evaluated by modifying the value of p(t) in the base case to p(t)=(E) 0.5 and (F) five to five minutes on/off pulse.

FIGS. 7A and B. Liquid phase epitaxy of GaN utilizing a diluted nitrogen plasma. Nitrogen was diluted in argon in a 1:9 ratio in order to reduce the concentration of nitrogen radicals in the system. (A) Resultant film is characterized by having two distinct growths i.e., epitaxial and polycrystalline. (B) Zoom into the epitaxial GaN layer.

FIG. 8A-E. Concentration profile of modified pulsing sequence. Concentration profiles were calculated using k_BR=1×10$^{-1}$ cm$^3$ mol$^{-1}$ s$^{-1}$, D_NGa=5×10$^{-6}$ cm$^2$ s$^{-1}$ and a modified pulse sequence. Concentration profile in (A) corresponds to pulse sequence presented in (C), while concentration profile in (B) corresponds to pulse sequence presented in (D). (E) Pulsed plasma-assisted LPE of GaN using a modified pulsing sequence. The sequence is described as five min on, then thirty min off, and then a one-to-thirty min on/off pulse, which is performed until the end of the experiment.

DETAILED DESCRIPTION

Figure 1A:
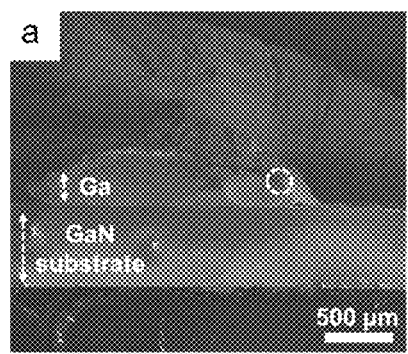
FIG. 1A-D. (A) Formation of a GaN crust on top of Ga after continuous exposure to nitrogen plasma. Dashed circle indicates (B) the interface between Ga and the GaN crust. (C) Growth of GaN on GaN substrate via pulsed plasma-assisted liquid phase epitaxy utilizing a five-minutes on, five-minutes off pulse. (D) Pulse experiment performed for a short period of time.

Prior art bulk LPE techniques for III-V compounds and alloys thereof have previously been performed under high pressure and high temperature conditions for long periods of time resulting in slow growth rates, which makes them cost prohibitive and therefore noncompetitive for producing e.g. semiconductors. In addition, prior art LPE films that are grown using halide vapor phase epitaxy (HYPE), metal organic chemical vapor deposition (MOCVD), and molecular beam epitaxy (MBE) also have drawbacks. In the case of HYPE the final thickness of the film is hard to control whereas in MOCVD and MBE the growth rate is slow and the films suffer from carbon contamination due to the precursors used in the processes.

In contrast, the LPE growth rates achieved in the processes disclosed herein exceed the typical growth rates via MOCVD or MBE and allow control of the final thickness of the film. Furthermore, the processes utilize precursors which prevent any type of carbon contamination. In addition, the methods are performed at low pressure and are not limited by vessel size, so they are easy to scale up, in comparison to prior art bulk techniques.

Definitions

Liquid-phase epitaxy (LPE) is a solution crystal growth technique for the deposition of crystallographically oriented thin films, thick layers, or discrete crystals on a seeding or template substrate, e.g. by depositing a molten metallic solution on the substrate. III-V compounds: Chemical compounds with at least one group III (IUPAC group 13) element and at least one group V element (IUPAC group 15). III refers to the boron group (in the periodic table columns) V refers to the nitrogen group (in the periodic table rows).

The Method(s)

Methods of performing LPE synthesis of e.g. films based on type III-V compounds and/or alloys thereof are disclosed. Exemplary method steps are conducted as follows:
Substrate A suitable substrate or template, typically in the form of e.g. a planar wafer or block, is provided and cleaned and/or polished well prior to beginning the production process. For example, a substrate may be cleaned e.g. by sonication (such an in acetone, methanol, etc.) or by using weak acids, and rinsing (e.g. in water), and then dried. Other cleaning methods are known in the art; see for example, issued U.S. Pat. No. 10,752,867, the complete contents of which are hereby incorporated by reference in entirety. It is especially important to remove e.g. carbon and/or oxygen from the surface of the substrate in order to prevent the formation of basal staking faults in the product, e.g. using ultraviolet/ozone exposure and/or wet chemical treatments such as ultrasonication in acetone for one hour followed by DI water for five minutes, e.g. 2 times.

By way of example, suitable materials include but are not limited to a III-V compound; a II-VI compound; a IV element or compound; metallic materials and semi-metallic materials; materials composed only of carbon (C); etc. Examples of particular compounds include but are not limited to: silicon (Si, e.g. monocrystalline silicon, cSi), silicon carbide (SiC), C (such as graphene, nanomesh); germanium (Ge), SiC, SiGe, GeC, Ti, Au, TiAu, TiN, sapphire (e.g. a monoblock substrate made of sapphire, etc. Substrates composed of combinations of these metals and materials are also encompassed as are substrates made of a conductive material such as an optionally doped semiconductor, and layered substrates comprising e.g. Ga—N-on-sapphire, Diamond, Silicon, Sapphire, Silicon Carbide, Gallium Phosphide, Gallium Arsenide, etc.

Prior to use the substrate may also be patterned i.e. etched or otherwise modified to include 3-dimensional features, e.g. for device fabrication.
Deposition of Metal on the Substrate Once a suitable substrate is provided, it is used to support and/or to be a template for forming e.g. a layer or film of a phase III-V material/metal, typically on one side or face of the substrate. Generally, a molten or liquid metal solution (generally at least 99% purified, such as 99.5, 99.6, 99.7, 99.8 or 99.9% purified) is deposited on a cleaned substrate or template. The metal may be deposited as a droplet (which spreads into a film or layer during heating) or film.

Types of metals that may be used to form the films include but are not limited to: various III-V compounds and alloys thereof, including but not limited to: Aluminium antimonide, Aluminium arsenide, Aluminium gallium arsenide, Aluminium gallium indium phosphide, Aluminium gallium nitride, Aluminium gallium phosphide, Aluminium indium arsenide, Aluminium nitride, Aluminium phosphide, Boron arsenide, Boron nitride, Boron phosphide, Gallium antimonide, Gallium arsenide, Gallium arsenide phosphide, Gallium indium arsenide antimonide phosphide, Gallium phosphide, Indium antimonide, Indium arsenide, Indium arsenide antimonide phosphide, Indium gallium arsenide, Indium gallium nitride, Indium gallium phosphide, Indium nitride, Indium phosphide, etc. In particular aspects, by way of example, III-V compounds may be III-N compounds, such as GaN, $GaSb_xN_{1-x}$, $GaBi_xN_{1-x}$, $AlSb_xN_{1-x}$, $Ga_{1-x}In_xSb_yN_{1-y}$, $GaAs_xN_{1-x}$, $GaSb_xP_{1-x}$, $AlSb_xP_{1-x}$, InGaN, AlN, InN or AlInGaN, or compounds comprising an element from column V, for example AsGa or InP. In addition, the use of various II-VI compounds such as CdTe, HgTe, CdHgTe, ZnO, ZnMgO, CdZnO and CdZnMgO is encompassed.

In an exemplary aspect, a suitable molten Group III metal such as Ga (e.g. of at least 99% purity) is placed on top of a previously cleaned substrate, e.g. as a droplet or as a film. The substrate loaded with metal is then placed inside a pressure chamber and the pressure is lowered to a suitable level. The level can be in the range of several mTorr to atmospheric pressure (760 Torr). For example, the pressure may be e.g. about 760 Torr, 700, 600, 500, 400, 300, 200, or 100 Torr, or a few Torr (e.g. 1-10 Torr), or about 1000, 750, 500, 250, 100, 50 or 25 mTorr, such as lower than about 20 mTorr. The atmosphere in the chamber is typically purged, e.g. with $H_2$ gas, to remove all oxygen. This may require at least one, and typically e.g. about 1-5, purging cycles.

Thereafter, the temperature of the substrate is raised, e.g. to at least about 400° C. to 800° C., e.g. about 400, 450, 500, 550, 600, 650, 700, 750 or 800° C., such as from about 500-600° C. The increase in temperature is generally performed without (in the absence of) flowing gases. Once the desired temperature is reached, any oxide layer that is present on the surface of the molten metal is reduced, e.g. by exposure to hydrogen gas or plasma for a period of time sufficient to perform the reduction e.g. from about 5-10 minutes. This step is also generally (optionally) performed under low pressure, e.g. less than about 25 mTorr, such as lower than about 20 mTorr.

After the reduction period, the flow of hydrogen is stopped, and the temperature is further raised to a desired temperature, generally in the range of from about 500° C. to about 1000° C., and the pressure of the entire system is lowered further, e.g. to from about 0.5 to about 0.75 torr.

For the LPE, the sample is then exposed to a pulsed Group V material plasma. The dissolution of radicals takes place only when the plasma is on. Conversely, the recombination of radicals inside the melt can occur when the plasma is either on or off. Thus, pulse experiments are intended to promote the recombination over the dissolution of radicals as an attempt to reduce the concentration of nitrogen inside the melt. Generally, pulsing involves cycles of exposure of the sample to the Group V material plasma e.g. from about 2 cycles or more (e.g. 2-10 cycles or more), depending on the desired thickness, each pulse of which lasts from about 1-10 minutes, such as about 1, 2, 3, 4, 5, 6, 7, 8, 9, or 10 minutes. In some aspects, the pulses are 5 minutes "on" with the same amount of time between pulses, i.e. with the pulse "off". However, in preferred aspects, the amount of "on" and "off" time is varied. For example, a repetitive sequence in which the plasma is on for a longer period of time (e.g. about 5 minutes) and then off by a longer period of time (e.g. about 5 minutes) is followed by a sequence using a shorter period of "on" time (e.g. 1-3 minutes, such as two minutes) and then and "off" time of about five minutes. The purpose of initially exposing the samples to plasma for five minutes is to rapidly increase the concentration of nitrogen. Subsequently, the two-to-five on/off time ratio promotes the transport of radicals to the surface of the substrate and reduces the nitrogen concentration at the surface of the epitaxial layer, preventing formation of a crust. The pulsing or interruption sequence depends upon the thickness of the molten metal, the pressure and the concentration of vapor phase species. This has been illustrated in a number of situations with modeling. One can use modeling to determine the exact sequence of interrupted cycles and/or pulsing sequences.

The forward power and flow rates may vary according to the material that is used, and generally range from about 50-150 W, such as about 100 W, and 50-150 sccm, such as about 100 sccm. In an exemplary aspect, the plasma is a nitrogen plasma and the forward power used is about 100 W with a nitrogen flow of about 100 sccm.

After the desired plasma exposure time has been met, the plasma is shut off and the chamber is cooled down. The cooled substrate with the LPE layer is ready for use. In some aspects, it may be necessary to remove a remaining excess molten layer. Once the excess molten layer is removed, the LPE layer can be further processed for device fabrication.

While the above steps are generally applicable to the growth of films, in some aspects, nanowires are made using similar methods. To fabricate a nanowire using this technology molten metal droplets, a supply of vapor phase species and an interrupted plasma sequence is used to grow nanowires through dissolution aided by plasma sequence (without sequence—the droplets may crust up). For example, one can grow GaSbxN1-x nanowires using molten metal droplets (Gallium, copper, gold, etc.) and use a vapor phase species in nitrogen (or V species) plasma with an interrupted scheme to control the growth. Dissolution is aided by the plasma and then epitaxial growth on a substrate is controlled by using a wire diameter that is controlled by droplet. The key is to grow nanowires of high quality with alloy compositions involving antimony, bismuth etc.

The methods disclosed herein can be modified to achieve desired properties of the end product. For example, if a film is being made, the method steps can be adjusted to result in an epitaxial layer of a desired thickness. For example, a molten Ga film is made as a thin film by providing nitrogen species in a plasma environment and then supplying Si or other species in a gas phase. By using the plasma sequences described above, one can produce epitaxial films of Si on suitable single crystal substrates.

Applications of the Technology

The methods described herein can be used to manufacture e.g. nanofilms, nanowires, epitaxial thin films (homoepitaxial or heteroepitaxial). These products can be used advantageously in a wide variety of applications. Examples include but are not limited to products and devices such as: semiconductors (e.g. direct band gap semiconductors); microwave amplifiers; high electron mobility transistors (HEMTs); various optoelectronics, e.g. for light, displays, storage, etc. such as in light bulbs, flat panel displays, and optical storage media such as CDs and DVS; photoelectrochemical electrodes, electrocatalysts, solar cells, etc.

Products such as these made by the methods described herein are also encompassed.

It is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Representative illustrative methods and materials are herein described; methods and materials similar or equivalent to those described herein can also be used in the practice or testing of the present invention.

All publications and patents cited in this specification are herein incorporated by reference as if each individual publication or patent were specifically and individually indicated to be incorporated by reference, and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual dates of public availability and may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as support for the recitation in the claims of such exclusive terminology as "solely," "only" and the like in connection with the recitation of claim elements, or use of a "negative" limitations, such as "wherein [a particular feature or element] is absent", or "except for [a particular feature or element]", or "wherein [a particular feature or element] is not present (included, etc.) . . . ".

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The invention is further described by the following non-limiting examples which further illustrate the invention, and are not intended, nor should they be interpreted to, limit the scope of the invention.

EXAMPLES

Example 1

In this disclosure, a method is provided for controlling the concentration of a Group V material inside a molten Group III material to avoid spontaneous nucleation on top of the molten Group III material and promote epitaxial growth. The method, which is based on intermitting plasma exposure, was developed experimentally and theoretically and the experimental observations correlated well with the results obtained from a mass transport model.

In particular, this example describes a method of conducting liquid phase epitaxy (LPE) of gallium nitride layers using pulsed nitrogen plasma. The pulse sequence of plasma (with on and off time scales) was been shown to be critical for enabling liquid phase epitaxy while avoiding crust formation on top of molten gallium. The approach presented here allows control of the concentration of nitrogen inside the molten gallium, and therefore, a means to limit any type of spontaneous nucleation. This is a first-of-its-kind demonstration for achieving liquid phase epitaxy of GaN using plasma excitation of nitrogen at low pressures. The methods can be extended to several other III-V compounds and alloys.

Experimental

Nitridation experiments were carried out in a custom-built, capacitively-coupled, radio-frequency (RF) plasma reactor. Details of the reactor can be found elsewhere.[34] Such reactors are available from commercial sources.

In a typical experiment Ga (99.99% purity) was placed on top of previously cleaned substrates either as a droplet or as a film. The cleaning procedure consisted of sonication in an acetone bath for 20-30 minutes, followed by sonication in a DI water bath for 5-10 minutes, and drying with dry air. The substrates were then placed inside the chamber and the chamber was pumped down until it reached the base pressure of the system (<20 mTorr). Subsequently, at least three hydrogen purging cycles were performed. After completion of the purging cycles, the temperature of the substrate holder was raised to 500-600° C. without flowing any gases. At that temperature, the samples were exposed to hydrogen or hydrogen plasma for 5-10 minutes to reduce any gallium oxide layer that was present on the surface of the molten Ga. After the reduction period, the flow of hydrogen was stopped, and the temperature was raised to the desired experimental temperature. The samples were then exposed to nitrogen plasma. The pressure of the system ranged between 0.5 and 0.75 torr. The forward power used during experimentation was 100 W with a nitrogen flow of 100 sccm. After the desired plasma exposure time has been met the plasma was shut off and the chamber was cooled down. Samples were taken out, cleaned, and characterized via scanning electron microscopy (SEM) utilizing a FEI Nova NanoLab™ SEM 600 SEM, and transmission electron microscopy (TEM) using a FEI Tecnai F20.

Results and Discussion

Figure 1B:
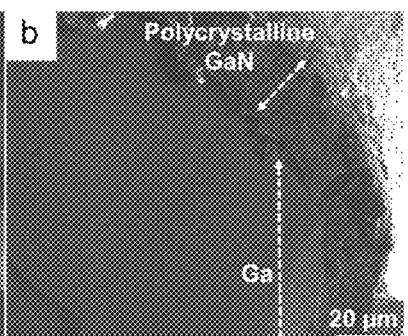

Plasma nitridation of molten Ga was performed in a RF plasma reactor using $N_2$ and Ga precursors following the experimental procedure explained above. GaN crystals 1 mm$^2$ and large surface area MOCVD grown (0001) GaN-on-sapphire substrates, were used as substrates. The furnace temperature was held at 800-900° C. Initially, it was found that a GaN crust was being formed on top of the Ga. This phenomenon is seen in FIG. 1(a)-(b). As reported in a previous study, the dissolution of N into Ga is significantly faster than the recombination of radicals.[34] Under these conditions, the concentration of nitrogen at the surface of the molten Ga can undergo a rapid saturation which results in the spontaneous nucleation of GaN via the spinodal decomposition mechanism.

Figure 1C:
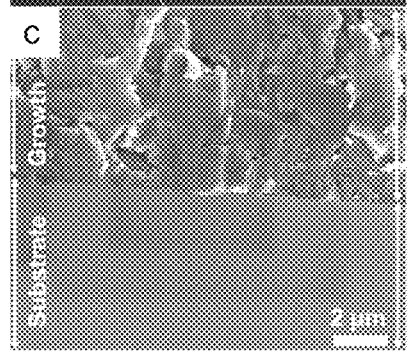
Figure 1D:
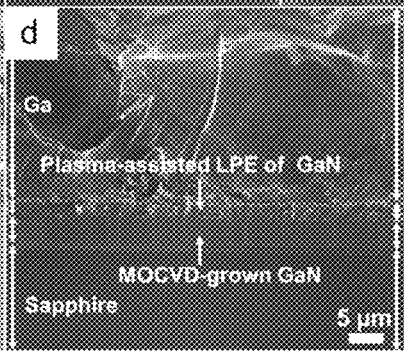

To promote the growth while decreasing the spontaneous nucleation, a pulse experiment, in which the sample is exposed intermittently to nitrogen plasma, was performed. The dissolution of radicals takes place only when the plasma is on. Conversely, the recombination of radicals inside the melt can occur when the plasma is either on or off. Thus, pulse experiments are intended to promote the recombination over the dissolution of radicals as an attempt to reduce the concentration of nitrogen inside the melt. The pulse was described as five minutes of plasma exposure, followed by five minutes without plasma and so on until the end of the experiment. A cross sectional view of the substrate used in this experiment, FIG. 1(c), depicts the growth of GaN on top of the GaN substrate. Evidence of growth on top of the substrate suggests that in the pulse experiment the concentration of nitrogen near the molten Ga was maintained below the spontaneous nucleation limit. However, no Ga was found, which indicates that Ga was completely consumed during the process. A shorter experiment was performed in an attempt to guarantee that not all Ga was consumed. A cross-sectional view of the substrate after the experiment is presented in FIG. 1(d). It was found that on top of the grown GaN layer there was a Ga film. This result indicates that nitrogen was dissolved through the molten Ga film promoting the growth of GaN on the substrate (liquid phase deposition).

Figure 2A:
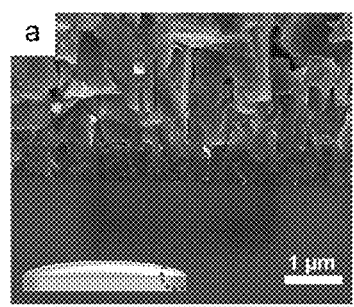
FIG. 2A-D. Growth of GaN via pulsed plasma-assisted LPE utilizing a Ga film with varying thickness. (A) Highly oriented GaN was obtained in the thinnest area of the film. (B) Epitaxial growth of GaN was obtained in a mid-point between the edge and the center of the film. (C)-(D) GaN crystals were obtained in the thickest area of the film.
Figure 2B:
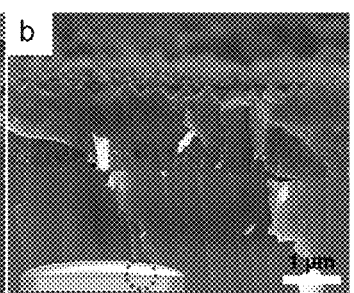
Figure 2C:
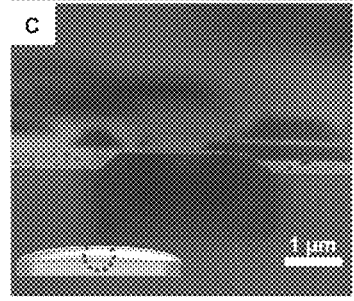
Figure 2D:
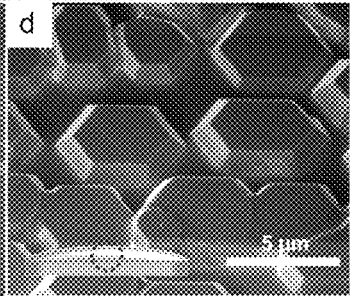

In the pulse experiments Ga was placed on top of the GaN-on-sapphire substrate as a drip. During the process, Ga agglomerates into a big droplet and then as the concentration of nitrogen inside the melt is increased it begins to spread. As a consequence of this phenomenon a Ga film with varying thickness was formed on top of the surface of the substrate. The type of GaN growth was found to be dependent on the thickness of the Ga film. The results suggest that the growth rate in the c-direction of films is inversely proportional to Ga film thickness. Close to the edge where the thickness was the thinnest, a highly oriented GaN film was obtained, FIG. 2(a). It is believed that due to the fast growth rate in the c-direction compared to the lateral growth rate, the crystals did not undergo complete coalescence. In a mid-point, between the edge and the center of the Ga film, a GaN film sample was obtained. FIG. 2(b) indicates that the GaN film was formed by GaN columns that merged together. Similarly to the previous case, it is believed that the film was obtained due to a fast growth rate in the c-direction of GaN crystals, which were grown epitaxially in the beginning of the process. In between of some of the columnar structures, the presence of voids was observed, suggesting a low quality of the film. However, the concentration of voids of the GaN film that was grown at the mid-point of the Ga film is significantly lower than that of the GaN film that was grew at the edge of the Ga film. This result suggests that the growth rate in the c-direction of the mid-point GaN layer was slower than that of the edge GaN layer. Finally, towards the center of the film, where the film was the thickest, nucleation of individual GaN crystals was observed. A cross-sectional view of one of the crystals shows good growth quality as the interface between the substrate and the crystals is almost unnoticeable, FIG. 2(c). The crystals had a form of flat truncated hexagonal pyramids, which is characteristic of the c-direction orientation. The size of the crystals varied between 1 and 5 gm in diameter and between 0.1 and 1 gm in height, FIG. 2(d). The crystals were further analyzed using TEM. The results, FIG. 3(a)-(d), indicated that the crystals were grown epitaxially. High-resolution TEM images of the interface show that the atomic arrangement of the GaN substrate is maintained in the GaN crystal. Additionally, no differences were found between the electron diffraction patterns of the substrate and the crystal, FIG. 3(e)-(f). Both were single crystal GaN patterns, taken at [1120] zone axis, and were aligned at exactly the same orientation. The ring pattern in the electron diffraction pattern of the GaN crystal corresponds to amorphous platinum that was deposited on top of the GaN crystal to make the TEM lamella. Imanishi et al. proved that when two GaN crystals coalesce along the a-direction no dislocations are formed.[35] Thus, the enlargement of c-oriented crystals induces the coalescence of crystals along the a-direction, which, at the end, results in the formation of a single crystalline film. The nucleation density of crystals obtained in this area however is low, which means that crystals need to grow significantly in the a-direction to coalesce with their neighbors.

In order to obtain homoepitaxial GaN films, the process was adjusted to promote the nucleation of crystals and their growth in the a-direction, as described below.

The results presented in this work suggest that the concentration of nitrogen inside the metal at the surface of the substrate is inversely proportional to the thickness of the film. This means that the concentration of nitrogen in the melt at the surface of the substrate is determined by the transport of nitrogen radicals from the surface of the Ga to the surface of the substrate. Due to the lack of a large thermal gradient along the z axis of the film it is assumed that there is no convection in the process. Therefore, the transport of nitrogen radicals to the surface of the substrate occurs through diffusion. The transport of radicals from the surface of the film to the surface of the substrate has two outcomes: (1) the concentration of nitrogen close to the substrate is increased, and (2) the concentration of nitrogen near the surface of the film is reduced. Thus, similar to the case of the recombination of radicals, the diffusion of radicals needs to be favored more than the dissolution of radicals in order to prevent the spontaneous nucleation of GaN. In the pulsed plasma-assisted LPE process this can be achieved by decreasing the on/off time ratio of the pulse sequence.

Figure 4:
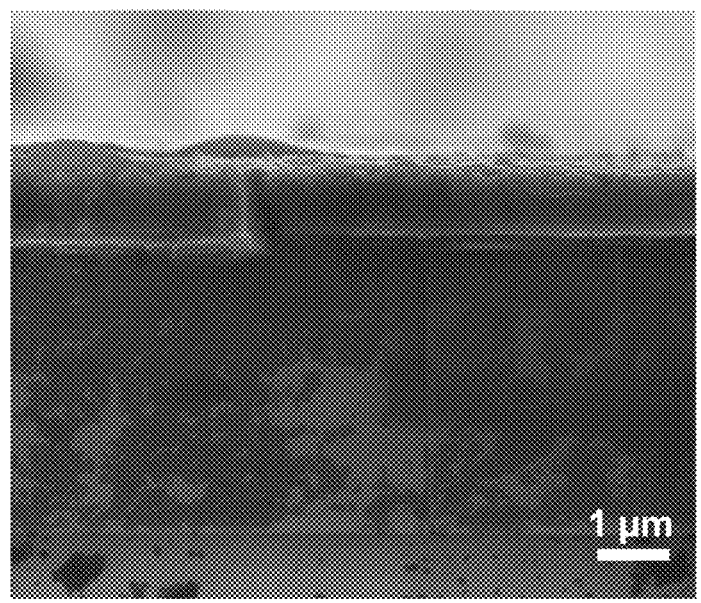
FIG. 4. Pulsed plasma-assisted LPE of GaN utilizing a modified pulse sequence. In this experiment a two minutes-on, five-minutes off pulse was used.
Figures 5A, 5B, 5C, 5D, 5E, 5F:
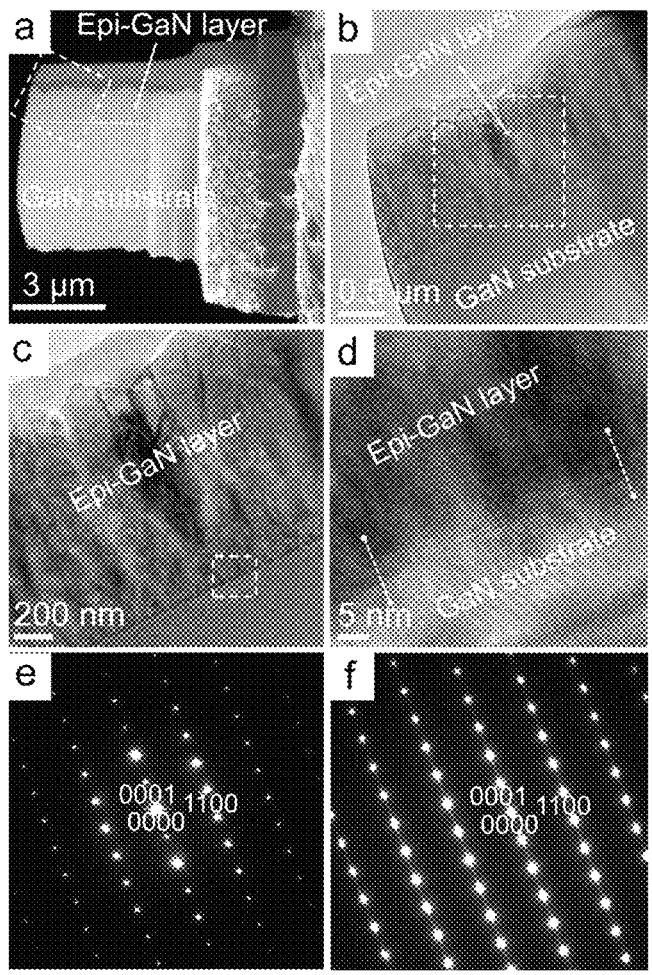
FIG. 5A-F. TEM characterization of the GaN film grown via the pulsed plasma-assisted LPE technique utilizing the modified pulse sequence. (A) SEM image of the TEM lamella used during characterization. White outlined area indicates the (B) area that was analyzed using TEM. (C) TEM image of the film. White outlined area indicates the interface between the grown layer and the substrate. (D) [11$\bar{2}$0] high-resolution TEM image of the interface. The area between the dashed lines indicates where the interface is. (E) Electron diffraction pattern of the substrate. (F) Electron diffraction pattern of the grown layer. Both patterns show the same [11$\bar{2}$0] zone axis and the same orientation.

To improve the quality of the films a new set of experiments with a different pulse sequence was performed. The new sequence is explained as follows: first, the plasma was on for five minutes followed by five minutes in which the plasma was off; then a repetitive sequence in which the plasma was on for two minutes and then off for five minutes was performed until the end of the experiment. The purpose of exposing the samples to plasma for five minutes in the first step was to rapidly increase the concentration of nitrogen. From previous experiments it was known that after five minutes of plasma exposure no GaN crust is formed. Thus, this step allows the initial nitrogen concentration of the melt into a growth regime to be set. On the other hand, the two-to-five on/off time ratio was intended to promote the transport of radicals to the surface of the substrate and to reduce the nitrogen concentration at the surface of the film. By doing this, a more uniform concentration of nitrogen along the Ga film was expected. The films obtained using this pulse configuration showed an improvement compared to films obtained previously. FIG. 4 shows the growth of a GaN film under these conditions. The adherence of the film to the underlying substrate is also good. As seen in FIG. 4, the cleave marks, which are due to the breaking of the sample, extend from the GaN layer grown via MOCVD to the GaN layer grown via pulsed plasma-assisted LPE. The quality of the film was maintained, and there was no polycrystalline growth on top, which indicates that the concentration of nitrogen was maintained in the Ostwald-Miers region during the entire length of the experiment. Further characterization of the sample was performed via TEM, FIG. 5(a)-(d). High resolution TEM images at the interface between the GaN substrate and the GaN grown layer [FIG. 5(d)], and electron diffraction patterns of both the substrate and the GaN layer [FIG. 5(e)-(f)], indicate epitaxial growth of GaN. High-resolution TEM image of the film, FIG. 5(c), shows the presence of defects at the interface as well as a high concentration of basal staking faults. The streaking of diffraction spots along the [0001] direction in the electron pattern of the GaN layer [FIG. 5(f)] confirms that the film contains a large number of basal stalking faults.[36] It is believed that the defects at the interface between the substrate and the grown GaN layer are due to the presence of carbon and/or oxygen at the surface of the substrate. Different techniques including ultraviolet/ozone exposure and wet chemical treatments are used to remove surface carbon and to reduce the native oxide on the GaN surface.[37] The GaN-on-sapphire substrates used in this work were not subjected to any type of surface treatment, thus it is expected that the surface of the substrates contained carbon or oxygen. The growth rate of the film was ~0.5 µm/h which is similar to growth rates obtained in MOCVD processes. However, this growth rate is significantly faster than the growth rate obtained by Novikov et al. during their plasma-assisted electroepitaxy process.[33]

Example 2. Modeling Studies

As reported previously, the concentration of nitrogen inside molten Ga that is exposed to nitrogen plasma is set by the interaction of five distinct processes, namely: surface adsorption, diffusion into the bulk, recombination inside the bulk, surface recombination, and desorption of species from the bulk.[34] Mathematically, the concentration of nitrogen inside the melt can be related to these processes by developing a mass transport model, Equation 1. Assuming that a Ga film is exposed uniformly to a flux of nitrogen radicals and there is no convection inside the film, the model can be described as a one-dimensional version of Fick's second law, Equation 2.

$$\frac{\partial C_N}{\partial t} + v \cdot \nabla C_N = D_{NGa} \nabla^2 C_N + R_{N,bulk} \qquad (1)$$

$$\frac{\partial C_N}{\partial t} = D_{NGa}\frac{\partial^2 C_N}{\partial z^2} + R_{N,bulk} \quad (2)$$

Where $R_{N,bulk}$ is the rate of N recombination in the bulk and is further described by the following equation, $$R_{N,bulk} = -k_{BR}C_N^2 \quad (3)$$

where $k_{BR}$ is the nitrogen bulk recombination reaction constant.

Furthermore, the model assumes that prior to plasma exposure, no nitrogen radicals had dissolved into the Ga film. Therefore, the initial condition is defined as $$C_N(z,t=0) = 0 \quad (4)$$

The model also states that there is no transport of nitrogen radicals from the Ga film to the substrate (z=0) and that the nitrogen radicals that stick on the surface of the film (z=L) can either recombine or diffuse inside the film. The consequent boundary conditions are defined by $$\left.\frac{\partial C_N}{\partial z}\right|_{z=0} = 0 \quad (5)$$

$$\left.-D_{NGa}\frac{\partial C_N}{\partial z}\right|_{z=L} = p(t)\, F_N S + R_{N,surf} \quad (6)$$

where L, $R_{N,surf}$, $F_N$, S, and p(t) are the thickness of the film, the rate of N recombination on the surface, the flux of N that strike the Ga surface, the sticking coefficient, and a pulse wave function, respectively. The recombination of N on the surface of Ga can be described by, $$R_{N,surf} = -\gamma_N F_N \quad (7)$$

where $\gamma_N$ is the recombination coefficient of nitrogen and is defined as the fraction of atoms striking the surface that undergo recombination reaction. On the other hand, the pulse wave function includes the pulsing effect into the model. The mathematical expression of the pulse wave is presented in the following equation.

$$p(t) = \frac{\tau}{T} + \sum_{n=1}^{\infty}\frac{2}{n\pi}\sin\left(\frac{\pi n}{T}\tau\right)\cos\left(\frac{2\pi n}{T}(t-\tau/2)\right) \quad (8)$$

Where $\tau$ and T are the pulse time and period, respectively. The pulse time determines the period in which the plasma is on (p(t)=1), whereas $\tau$-T represents the period in which the plasma is off (p(t)=0). For purposes of this work, Equation 8 was truncated with n equals to 100.

The solution of Equation 2, utilizing the initial and boundary conditions stated in Equations 4-6, provides the concentration profile of nitrogen inside the film as function of time, $C_N(z, t)$. Two assumptions were made to simplify the system: (1) the sticking coefficient is 1.0, and (2) the recombination on the surface is negligible. These two assumptions state that all radicals that strike the surface of the film are diffused into it. Argoitia et al. reported that because of the slow rate of recombination of nitrogen radicals on the surface of Ga, that nitrogen atoms diffuse into the bulk which leads to the formation of GaN crystals.[26] Furthermore, the small recombination coefficient of nitrogen on other metals suggests that the recombination of nitrogen radicals on the surface of Ga can be neglected. The recombination coefficient of nitrogen on Fe, Ni, and Cu, was reported as $2\times10^{-3}$, $6.7\times10^{-5}$, and $6.8\times10^{-2}$, respectively.[38] Finally, the values of the remaining three parameters i.e., $k_{BR}$, $D_{NGa}$, and p(t) were set in order to obtain $C_N(z, t)$. The flux of species was set to $5\times10^{-7}$ mol cm$^{-2}$ s$^{-1}$ as it is in good accordance with the flux of N radicals in a nitrogen plasma reported by M. Meyyappan.[39] Neither the diffusion coefficient nor the recombination reaction constant is available in the literature. Inouye et al. studied the diffusion coefficient of nitrogen in molten iron. Furthermore, the researchers developed an equation that relates the diffusion coefficient with temperature.[40] Utilizing this relationship at temperatures between 800 and 1000° C. (the temperatures that the growth of GaN takes place), it was found that the diffusion coefficient varies between as $3\times10^{-7}$ cm$^2$ s$^{-1}$ and $1\times10^{-6}$ cm$^2$ s$^{-1}$ Assuming a middle point, the diffusion coefficient was set to $5\times10^{-6}$ cm$^2$ s$^{-1}$. Finally, the recombination reaction constant was determined by a trial and error process in which the value was modified until the shape of the nitrogen concentration profile behave similarly to the pressure curve presented in our previous study.[34] The constant value was determined as $1\times10^{-1}$ cm$^3$ mol$^{-1}$ s$^{-1}$. $C_N(z, t)$ was obtained by solving numerically Equation 2 for z<0<1 mm and 0<t<3000 s.

Bulk recombination, diffusion of radicals inside the melt, and pulsing are determined by these three parameters: $k_{BR}$, $D_{NGa}$, and p(t), respectively. Further, the influence of diffusion, recombination in the bulk, and pulsing can be determined by modifying one of the parameters while maintaining the other two parameters constant. The influence of the bulk recombination was determined by obtaining $C_N(Z, t)$, such that $k_{BR}$ equals to 0, $1\times10^{-1}$, 1, and 10 cm$^3$ mol$^{-1}$ s$^{-1}$. Similarly, the effect of diffusion was determined by calculating $C_N(z, t)$, such that $D_{NGa}$ equals to $5\times10^{-4}$, $5\times10^{-5}$ cm$^2$, $5\times10^{-6}$ cm$^2$, and $5\times10^{-7}$ cm$^2$ s$^{-1}$. Finally, the influence of pulsing was determined by incorporating a five-to-five minutes on/off pulse. FIG. 6(a)-(f) depicts the influence of bulk recombination, diffusion and pulsing by presenting the concentration of nitrogen at z equals to 0.1 and 0.9 mm under different conditions. Additional data is presented in the Supplemental Information. Bulk recombination was found to be responsible for the maximum amount of nitrogen that can be dissolved into Ga. The larger the recombination rate was the sooner the maximum was reached and the smaller that value was. Additionally, it was found that the recombination affects the nitrogen concentration uniformity along the film. As the bulk recombination becomes more dominant the concentration gradient becomes larger. From these results, it is observed that diffusion of nitrogen radicals inside is responsible for the concentration uniformity along the film. The smaller the diffusion coefficient is, the larger the gradient is. Experimentally, it was found that the concentration of nitrogen inside the melt was a function of the thickness of the film. Thus, it is assumed that this process is diffusion limited. Results regarding pulsing, FIG. 6(f) showed that the concentration in the pulsing case was lower than in the case when the plasma was on [FIG. 6(f)]. This is explained by the fact that the film was exposed to plasma for twice as much time. To make a fair comparison, a new concentration profile with p(t)=0.5 was calculated. Results are presented in FIG. 6(e). By doing this, the total number of nitrogen radicals that strike the surface of Ga after 3000 seconds is the same for both the on/off pulse and the p(t)=0.5 cases. As seen from FIG. 6(e)-(f), the average nitrogen concentration value of the pulsing experiment was lower at z=0.9 mm and higher at z=0.1 mm than when p(t)=0.5. This means that the use of pulsing allowed for more uniform nitrogen concentration distribution along the Ga film. However, the overall values are similar, which suggests that the reduction in the flux of nitrogen radicals can also promote the epitaxial growth of GaN while decreasing homogeneous nucleation. To test this hypothesis a new growth experiment was performed. GaN on sapphire substrates with Ga on top were exposed continuously to a $N_2$/Ar (1:9) plasma. By using a dilute nitrogen plasma, it was expected to reduce the total number of nitrogen radicals that strike the surface. As seen from FIG. 7(a), the resultant film was characterized by two distinct types of growth. On top of the substrate GaN was grown epitaxially, but as the layer became thicker, the growth became polycrystalline. The epitaxial layer, FIG. 7(b), was found to be similar to the epitaxial layer described previously. However, the growth rate was higher in this case. The growth rate of the epitaxial layer utilizing the dilute nitrogen plasma was ~1.6 pm/h. This rate was calculated utilizing the entire length of the experiment which means that the rate accounts for the time in which the polycrystalline growth took place. Therefore, the actual growth rate of the epitaxial layer could be even higher. The transition from epitaxial to polycrystalline growth indicates that the concentration of nitrogen inside the melt moved from the Ostwald-Miers region to the homogeneous nucleation region as the experiment was being performed. This phenomenon is a consequence of a continuous increment in the concentration of nitrogen. Over time, as seen in FIG. 8(a)-(e), the concentration inside the melt increases independently of the flux of nitrogen radicals. Nonetheless, by using a dilute nitrogen plasma, the nitrogen concertation was kept into the Ostwald-Miers region for longer time in comparison to the non-diluted nitrogen plasma resulting in a thicker GaN epitaxial layer. Finally, the concentration profile of the experiment that was performed utilizing the modified pulse sequence was calculated, FIG. 8(a). The sequence, FIG. 8(c) is described as five minutes on, then five minutes off, and then a two-to-five minutes on/off pulse, which is performed until the end of the experiment. Results showed that in the first five minutes of exposure to plasma the concentration of nitrogen inside the film increased rapidly; then when the two-to-five pulse sequence was started, the rate in which the concentration increases in time decreased. By changing the second part of the sequence to a one-to-five min pulse sequence it was found that the slope decreased even further, which resulted in the concentration remaining almost constant, FIG. 8(b). In addition to the change in slope, the second part of the pulse sequence was responsible for decreasing the concentration gradient. If the system is perfectly known, the initial plasma exposure time would be used to set the concentration of nitrogen inside the melt, whereas the proper on/off ratio in the consequent pulse would allow the concentration to be maintained constant while decreasing the concentration gradient. As a proof of concept, a new experiment utilizing a modified pulse sequence was performed. The sequence was described as five minutes on, then thirty minutes off, followed by a one-to-thirty min on/off pulse. The results, FIG. 8(e), showed the growth of an epitaxial GaN layer. The layer was ~13.5 μm thick and had only Ga on top even though the experiment was performed for 9 hours. This result indicates that the second part of the pulse allowed the concentration of nitrogen to be maintained within the Ostwald-Miers region for a longer time.

Example 3. Experiments with Alloys

VLPE experiments for the synthesis of III-N alloys and GaN have been conducted in a similar fashion with regards to substrate cleaning with acetone and DI water sonication, a thin liquid film of gallium formation on the substrate as well as nitrogen plasma parameters such as power, flow rate, pressure and on/off pulsing. The main difference between the experiments for the growth of epitaxial GaN and other ternary alloys such as GaBiN and GaSbN is the growth temperature was lower (700C-800C) in order to promote group V atom substitution without phase segregation, and also the introduction of Sb, $SbCl_3$ or Bi powders into the system as a source of group V species.

Example 4. Additional Applications of this Technology

1. Large Area Growth of GaN
The LPE system can be easily scaled-up which enables the production of large area GaN films.
2. Growth of GaN on Different Substrates
GaN nitride can be grown on different substrates using the proposed LPE technique. When crystalline substrates are used the resultant GaN growth is epitaxial. For example, growth of GaN films on Si, diamond, among others, is needed to develop new high-power electronic technologies. Conversely, when non-crystalline substrates are used highly oriented films are obtained.
3. Growth of Doped GaN
GaN films can be easily doped using the LPE technique. Contrary to the gas phase techniques our technology allows to provide the dopants either in the gas or in the solid phase limiting any type of dopant passivation that might occur. P-type doping of GaN in current phase techniques is achieved using Mg, however during the process the Mg forms a Mg—H complex and passivates the Mg acceptor. Because of that it is required to perform an additional annealing step to remove the hydroge. In our technology Mg-doped Gan films can be obtained without using any precursor that contains hydrogen atoms which eliminates the need of the annealing step.
4. LPE of Oxides, Sulfides and Phosphides
Oxygen plasmas on molten Group III metals could easily be used to create LPE layers of respective oxides. For example, one can do LPE of $Ga_2O_3$ on single crystal substrates using the proposed pulsed plasma technique. Similarly, the same techniques could be extended to alumina, indium oxides etc. Also, the concept could cover systems involving Arsenides, sulfides, phosphides, etc. Examples include GaP, GaAs, AlP, InP, InAs, AlAs etc.
5. LPE of Group III-V Alloys
The concept could be extended to growing alloys of Group III-V alloys. For example, Group III metals could be combined with other elements such as antimony, bismuth and others and exposed to pulsed plasmas. Such growth experiments could lead to Group III-V alloys such as $GaSb_xN_{1-x}$ alloys, $GaBi_xN_{1-x}$ alloys etc, These systems could include AlGaN, InGaN, GaSbN, GaBiN, AlBiN, respective oxides, sulfides and phosphides, etc.
6. Growth of Bulk GaN
LPE of GaN seeds can be used to grow hulk GaN. Similarly, to the case of the large area GaN films, the process can be easily scale up thus allowing the growth of large GaN crystals.
7. V to III Ratio
One key aspect in the growth of highly crystalline III-V semiconductor materials is the control of the V/III ratio in the gas phase in the vicinity of the substrate, which in other techniques such as HVPE, creates the need of an additional supply of the V element precursor. In our LPE technique, the concentration of the V element, i.e. $N_2$, can be easily controlled by varying the plasma pulse sequence.

8. Different Morphologies

Our LPE process can also be used for the growth of different morphologies of III-V materials. When the gallium is evenly spread throughout the substrate, epitaxial film growth of GaN is obtained. In contrast, if gallium droplets are sprayed on the substrate in patterned arrays, the expected growth would be 1D structures.

CONCLUSIONS

This work presents the development of a novel low-pressure technique for liquid-phase epitaxy of GaN based on the interaction between molten Ga and nitrogen plasma. Liquid phase epitaxy of GaN was performed by covering a substrate with molten Ga and then exposing the sample to nitrogen plasma. In these experiments single crystalline GaN crystals and MOCVD-grown GaN-on-sapphire wafers were used as substrates. Continuous exposure of Ga to nitrogen plasma resulted in the formation of a GaN crust that prevented further dissolution of nitrogen radicals. The formation of the GaN crust can be explained by the spinodal decomposition mechanism once the concentration of nitrogen inside the Ga has reached a limit. To control the concentration of nitrogen inside the melt, a unique concept of pulsed plasma was introduced. Results showed that pulsed plasma-assisted liquid phase epitaxy allowed the delay of spontaneous nucleation while promoting the epitaxial growth of GaN. High resolution TEM images at the interface between the GaN substrate and the GaN grown layer, and electron diffraction patterns of both the substrate and the GaN layer confirmed that epitaxial GaN layers were obtained using this technique. The dissolution of radicals takes place only when the plasma is on. Conversely, the recombination of radicals inside the bulk and the diffusion of species from the surface of Ga to the surface of the substrate can occur when the plasma is on or off. Thus, in the pulsed plasma-assisted LPE process, the recombination of radicals in the bulk and the diffusion of species into the metal are favored compared to the dissolution of radicals. This is reflected in a lower nitrogen concentration at the surface of the metal and a higher concentration of nitrogen at the surface of the substrate. A parametric study was presented to discuss the effect of bulk recombination, diffusion, and pulsing in the concentration of nitrogen into the molten Ga. Results showed that bulk recombination is responsible for the maximum amount of nitrogen that can be dissolved into Ga. The diffusion of radicals, on the other hand, determined the concentration gradient along the film. The results regarding the use of a pulse confirmed the hypothesis that pulsing reduces the concentration of nitrogen at the surface of the metal and increases the concentration of nitrogen at the surface of the substrate. Furthermore, by modifying the pulse sequence, it was observed that with the proper manipulation of the initial plasma exposure time and with the appropriate ratio of the consequent on/off pulse it is possible to maintain the concentration of nitrogen inside the molten metal constant. This means that the concertation of nitrogen in this type of process can be precisely controlled in such a way that is optimal for epitaxial grow of GaN.

REFERENCES

1. Levinshtein, M. E.; Rumyantsev, S. L.; Shur, M. S., Properties of Advanced Semiconductor Materials: GaN, AlN, InN, BN, SiC, SiGe. John Wiley & Sons: 2001.
2. Flack, T. J.; Pushpakaran, B. N.; Bayne, S. B., Journal of Electronic Materials 2016, 45 (6), 2673-2682.
3. Tamura, S.; Anda, Y.; Ishida, M.; Uemoto, Y.; Ueda, T.; Tanaka, T.; Ueda, D. In Recent Advances in GaN Power Switching Devices, 2010 IEEE Compound Semiconductor Integrated Circuit Symposium (CSICS), 3-6 Oct. 2010; 2010; pp 1-4.
4. Bose, B. K., Proceedings of the IEEE 2017, 105 (11), 2007-2010.
5. Zhang, A. P.; Ren, F.; Anderson, T. J.; Abernathy, C. R.; Singh, R. K.; Holloway, P. H.; Pearton, S. J.; Palmer, D.; McGuire, G. E., Critical Reviews in Solid State and Materials Sciences 2002, 27 (1), 1-71.
6. Mishra, U. K.; Shen, L.; Kazior, T. E.; Wu, Y. F., Proceedings of the IEEE 2008, 96 (2), 287-305.
7. Steranka, F. M.; Bhat, J.; Collins, D.; Cook, L.; Craford, M. G.; Fletcher, R.; Gardner, N.; Grillot, P.; Goetz, W.; Keuper, M.; Khare, R.; Kim, A.; Krames, M.; Harbers, G.; Ludowise, M.; Martin, P. S.; Misra, M.; Mueller, G.; Mueller-Mach, R.; Rudaz, S.; Shen, Y. C.; Steigerwald, D.; Stockman, S.; Subramanya, S.; Trottier, T.; Wierer, J. J., physica status solidi (a) 2002, 194 (2), 380-388.
8. Hangleiter, A., MRS Bulletin 2011, 28 (5), 350-353.
9. Van Vechten, J. A., Physical Review B 1973, 7 (4), 1479-1507.
10. Karpiński, J.; Jun, J.; Porowski, S., Journal of Crystal Growth 1984, 66 (1), 1-10.
11. Boćkowski, M.; Strąk, P.; Grzegory, I.; Porowski, S., In Technology of Gallium Nitride Crystal Growth, Ehrentraut, D.; Meissner, E.; Bockowski, M., Eds. Springer Berlin Heidelberg: Berlin, Heidelberg, 2010; pp 207-234.
12. Dwiliński, R.; Wysmołek, A.; Baranowski, J.; Kamińska, M.; Doradziński, R.; Garczyński, J.; Sierzputowski, L.; Jacobs, H., AcPPA 1995, 88 (5), 833-836.
13. Doradziński, R.; Dwiliński, R.; Garczyński, J.; Sierzputowski, L. P.; Kanbara, Y., In Technology of Gallium Nitride Crystal Growth, Ehrentraut, D.; Meissner, E.; Bockowski, M., Eds. Springer Berlin Heidelberg: Berlin, Heidelberg, 2010; pp 137-160.
14. Yamane, H.; Shimada, M.; Clarke, S. J.; DiSalvo, F. J., Chemistry of Materials 1997, 9 (2), 413-416.
15. Ehrentraut, D.; Meissner, E., In Technology of Gallium Nitride Crystal Growth, Ehrentraut, D.; Meissner, E.; Bockowski, M., Eds. Springer Berlin Heidelberg: Berlin, Heidelberg, 2010; pp 235-244.
16. Avrutin, V.; Silversmith, D. J.; Mori, Y.; Kawamura, F.; Kitaoka, Y.; Morkoc, H., Proceedings of the IEEE 2010, 98 (7), 1302-1315.
17. Oshima, Y.; Yoshida, T.; Eri, T.; Watanabe, K.; Shibata, M.; Mishima, T., In Technology of Gallium Nitride Crystal Growth, Ehrentraut, D.; Meissner, E.; Bockowski, M., Eds. Springer Berlin Heidelberg: Berlin, Heidelberg, 2010; pp 79-96.
18. Koukitu, A.; Kumagai, Y., In Technology of Gallium Nitride Crystal Growth, Ehrentraut, D.; Meissner, E.; Bockowski, M., Eds. Springer Berlin Heidelberg: Berlin, Heidelberg, 2010; pp 31-60.
19. Hemmingsson, C.; Monemar, B.; Kumagai, Y.; Koukitu, A., Growth of III-Nitrides with Halide Vapor Phase Epitaxy (HVPE). In Springer Handbook of Crystal Growth, Dhanaraj, G.; Byrappa, K.; Prasad, V.; Dudley, M., Eds. Springer Berlin Heidelberg: Berlin, Heidelberg, 2010; pp 869-896.
20. Liu, L.; Edgar, J. H., Materials Science and Engineering: R: Reports 2002, 37 (3), 61-127.
21. Hersee, S. D.; Sun, X.; Wang, X., Nano Letters 2006, 6 (8), 1808-1811.

22. Bolshakov, A. D.; Fedorov, V. V.; Shugurov, K. Y.; Mozharov, A. M.; Sapunov, G. A.; Shtrom, I. V.; Mukhin, M. S.; Uvarov, A. V.; Cirlin, G. E.; Mukhin, I. S., Nanotechnology 2019, 30 (39), 395602.
23. Koleske, D. D.; Wickenden, A. E.; Henry, R. L.; Twigg, M. E., Journal of Crystal Growth 2002, 242 (1), 55-69.
24. Meissner, E.; Hussy, S.; Friedrich, J., In Technology of Gallium Nitride Crystal Growth, Ehrentraut, D.; Meissner, E.; Bockowski, M., Eds. Springer Berlin Heidelberg: Berlin, Heidelberg, 2010; pp 245-273.
25. Thurmond, C. D.; Logan, R. A., Journal of The Electrochemical Society 1972, 119 (5), 622-626.
26. Argoitia, A.; Hayman, C. C.; Angus, J. C.; Wang, L.; Dyck, J. S.; Kash, K., Applied Physics Letters 1997, 70 (2), 179-181.
27. Hussy, S.; Meissner, E.; Berwian, P.; Friedrich, J.; Müller, G., Journal of Crystal Growth 2008, 310 (4), 738-747.
28. Sun, G.; Meissner, E.; Berwian, P.; Müller, G.; Friedrich, J., Journal of Crystal Growth 2007, 305 (2), 326-334.
29. Hussy, S.; Berwian, P.; Meissner, E.; Friedrich, J.; Müller, G., Journal of Crystal Growth 2008, 311 (1), 62-65.
30. Logan, R. A.; Thurmond, C. D., Journal of The Electrochemical Society 1972, 119 (12), 1727-1735.
31. Chandrasekaran, H.; Sunkara, M. K., MRS Proceedings 2001, 693.
32. Tanaka, A.; Funayama, Y.; Murakami, T.; Katsuno, H., Journal of Crystal Growth 2003, 249 (1), 59-64.
33. Novikov, S.; Foxon, C., Journal of Crystal Growth 2012, 354 (1), 44-48.
34. Carreon, M. L.; Jaramillo-Cabanzo, D. F.; Chaudhuri, I.; Menon, M.; Sunkara, M. K., Journal of Vacuum Science & Technology A: Vacuum, Surfaces, and Films 2018, 36 (2), 021303.
35. Imanishi, M.; Murakami, K.; Imabayashi, H.; Takazawa, H.; Todoroki, Y.; Matsuo, D.; Maruyama, M.; Imade, M.; Yoshimura, M.; Mori, Y., Applied Physics Express 2012, 5 (9), 095501.
36. Zakharov, D. N.; Liliental-Weber, Z.; Wagner, B.; Reitmeier, Z. J.; Preble, E. A.; Davis, R. F., Physical Review B 2005, 71 (23), 235334.
37. Lee, K. N.; Donovan, S. M.; Gila, B.; Overberg, M.; Mackenzie, J. D.; Abernathy, C. R.; Wilson, R. G., Journal of The Electrochemical Society 2000, 147 (8), 3087-3090.
38. Rahman, M. L.; Linnett, J. W., Trans. Faraday Society 1971, 67 (0), 183-190.
39. Meyyappan, M., Materials Research Society Internet Journal of Nitride Semiconductor Research 1997, 2.
40. Inouye, M.; Kojima, Y.; Choh, T.; Uekawa, S.; Yamada, Y., Tetsu-to-Hagane 1973, 59 (2), 205-213.

While the invention has been described in terms of its several exemplary embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

We claim:

1. A method of making an epitaxial layer of a III-V compound, comprising
    positioning a liquid phase Group III metal or alloy thereof on a substrate; and
    exposing the liquid phase Group III metal or alloy thereof to a pulsed Group V plasma to form the epitaxial layer of the III-V compound on a surface of the substrate.
2. The method of claim 1, wherein the Group III metal or alloy thereof is Ga and the Group V plasma is nitrogen plasma.
3. The method of claim 1, wherein the step of exposing is performed under low pressure.
4. The method of claim 1, further comprising, prior to the step of exposing, reducing the liquid phase Group III metal or alloy thereof.
5. The method of claim 4, wherein the step of reducing is performed at a temperature in the range of from about 500° C. to about 600° C.
6. The method of claim 1, wherein the step of exposing is performed at a temperature in the range of from about 200 to about 1000° C.
7. The method of claim 1, wherein the step of exposing is performed with a pulse sequence in which the plasma is
    i) on for an initial period of time, then
    ii) off for a first period of time and then on for a second period of time; wherein step ii) is repeated a plurality of times.
8. The method of claim 7, wherein the initial period of time and the first period of time are the same.
9. The method of claim 7, wherein the second period of time is shorter than the first period of time.
10. The method of claim 7, wherein the initial period of time ranges from 0.1-10 minutes, the first period of time ranges from 0.5-10 minutes and the second period of ranges from 0.1-10 minutes.
11. The method of claim 7, wherein step ii) is performed at least twice.
12. The method of claim 1, wherein the epitaxial layer is homoepitaxial.
13. The method of claim 1, wherein the epitaxial layer is heteroepitaxial.
14. The method of claim 1, wherein the Group III metal or alloy thereof is an alloy comprising antimony.

* * * * *